United States Patent [19]

Zappe

[11] 4,029,975

[45] June 14, 1977

[54] LOW-CROSSTALK-AUTOMATIC RESETTING SCHEME FOR JOSEPHSON JUNCTION LOGIC CIRCUIT

[75] Inventor: Hans H. Zappe, Granite Springs, N.Y.

[73] Assignee: International Business Machines Corporation, Armonk, N.Y.

[22] Filed: Jan. 14, 1975

[21] Appl. No.: 540,762

Related U.S. Application Data

[63] Continuation of Ser. No. 422,959, Dec. 7, 1973, abandoned.

[52] U.S. Cl. .............................. 307/306; 307/212; 307/277; 357/5
[51] Int. Cl.² ................ H03K 3/38; H03K 19/195; H01L 39/22
[58] Field of Search ............... 357/5; 307/212, 277, 307/306

[56] References Cited

UNITED STATES PATENTS

| | | | |
|---|---|---|---|
| 3,458,735 | 7/1969 | Fiske | 357/5 X |
| 3,573,662 | 4/1971 | Fulton | 307/306 X |
| 3,758,795 | 9/1973 | Anacker et al. | 307/212 X |
| 3,784,854 | 1/1974 | Herrell | 307/212 |
| 3,843,895 | 10/1974 | Hamel et al. | 307/306 X |

*Primary Examiner*—John Zazworsky
*Attorney, Agent, or Firm*—Sughrue, Rothwell, Mion, Zinn & Macpeak

[57] ABSTRACT

A Josephson logic network which includes high and low transmission line impedance sections in the feeder line enables multiple logic devices to be connected in series to the same feeder line with minimum crosstalk between the logic devices. Also, the arrangement of the high and low impedance sections results in resetting of a switched Josephson logic device without the need for altering the d.c. current supplied to the feeder line.

17 Claims, 4 Drawing Figures

U.S. Patent June 14, 1977 4,029,975
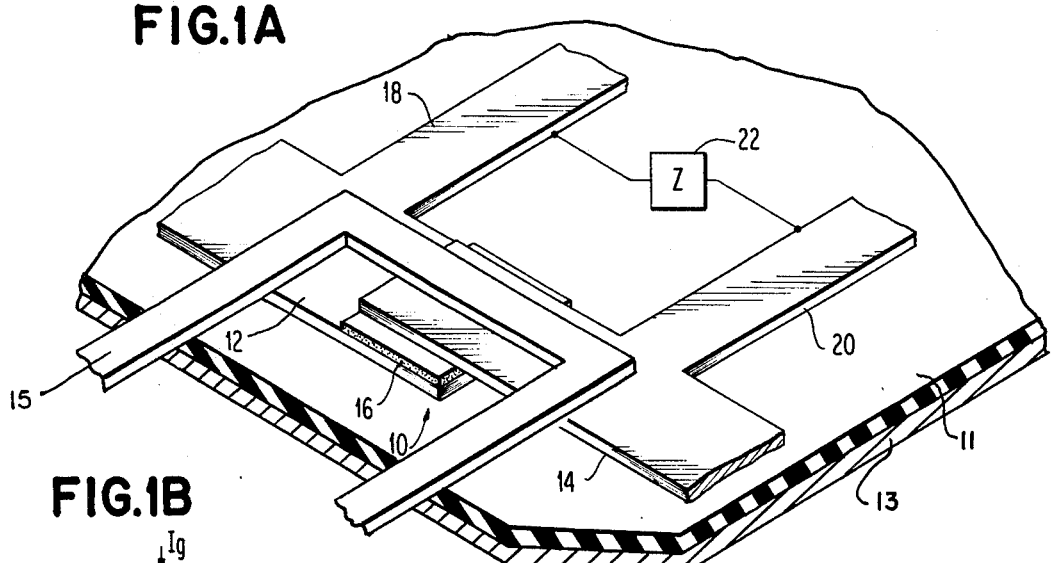
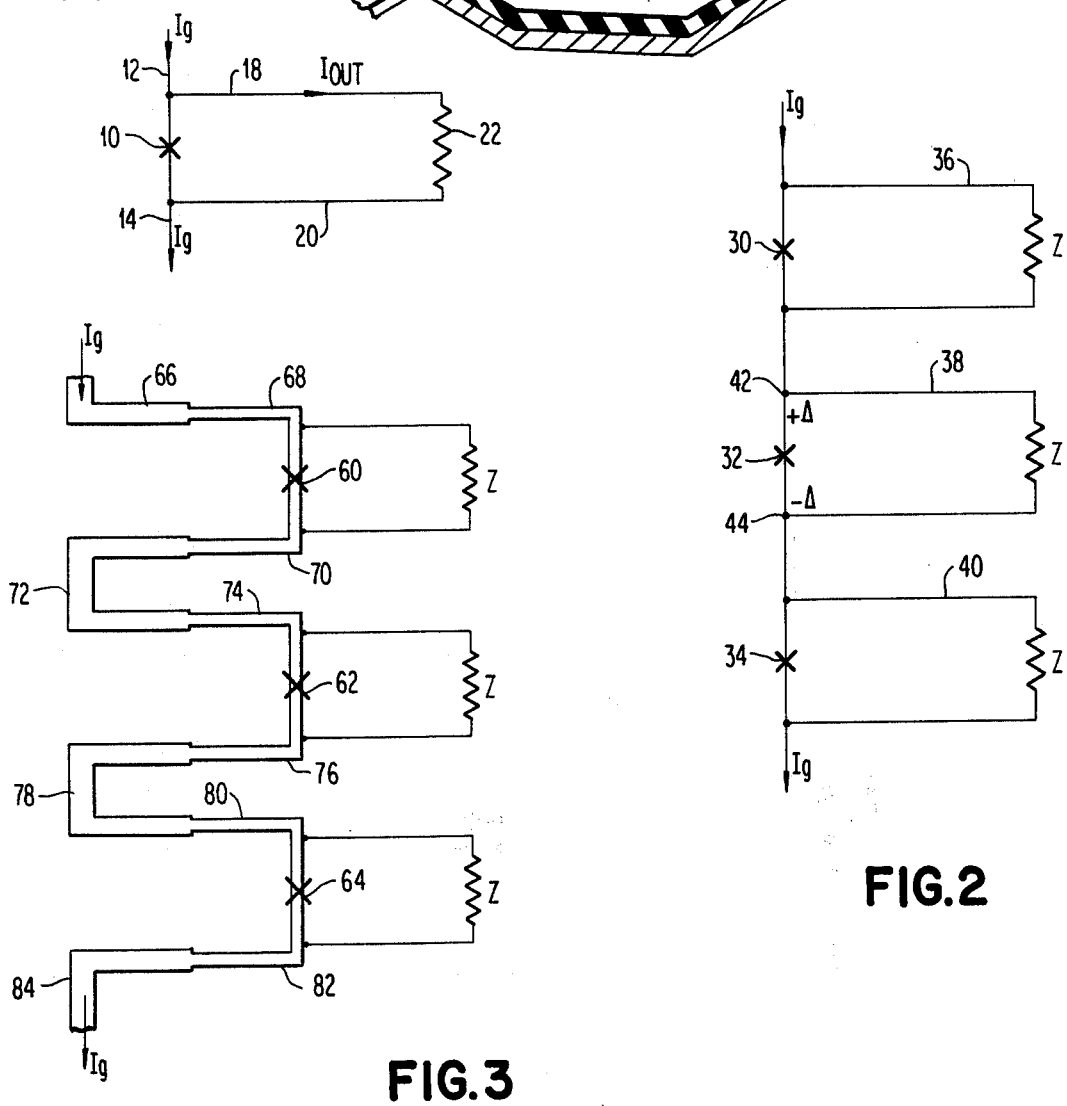

LOW-CROSSTALK-AUTOMATIC RESETTING SCHEME FOR JOSEPHSON JUNCTION LOGIC CIRCUIT

RELATED APPLICATIONS

This application is a continuation of application Ser. No. 422,959, filed Dec. 7, 1973, and now abandoned.

BACKGROUND OF THE INVENTION

The invention is in the field of Josephson tunnelling junctions, and specifically is related to logic arrays using Josephson tunnelling junctions.

Basically, a Josephson logic array comprises a plurality of logic gates, e.g., NOR, NAND, etc., each having one or several Josephson tunnelling junctions as a switching element. As is well known, the d.c. I-V characteristics of a Josephson tunnelling junction make the device suitable for use as the switching element of a logic device. A current is applied to the junction via a superconducting feeder line. Input control currents are applied as logic inputs to control superconductors overlaying the junction. A circuit consisting of superconductors and a d.c. resistance is connected in parallel with the junction and serves as the output line.

The logic inputs are applied to cause the junction to switch from a superconducting state, where the voltage thereacross equals zero, to a nonsuperconducting state where the voltage equals $2\Delta/e$, the gap voltage, or less. In the latter state, current flows through the output path.

In a Josephson logic array, the logic devices are connected together to perform a more complex logic function. The output paths of logic devices at one logic level may be positioned to serve as the control lines (logic inputs) of logic devices in a subsequent logic level. Furthermore, many Josephson junctions in the array are preferably connected in series to reduce the total current supply needed in the array.

Preferred device geometry for a Josephson logic device includes a superconducting ground plane, an insulating material overlaying the ground plane, and superconducting lines serving as the gate current feeder line overlaying the insulating layer. The junction itself is formed between overlapping portions of the latter mentioned superconducting lines.

The existence of the ground plane and insulating layer results in the feeder line being a transmission line having a finite non-zero impedance to transients. In an array, when one device switches to the $v=2\Delta/e$ state, transient current pulses flow towards the adjacent devices. Even though the adjacent devices may be superconducting to d.c. current, they exhibit a finite non-zero impedance to the transient current pulses. The result is that the current pulse will travel into the output paths of adjacent logic devices and cause either false indication of a logic output or false activation of a logic device at a subsequent level. This problem is known as crosstalk in the array. It is not confined to the devices adjacent the one which switches to the $v=2\Delta/e$ state but spreads throughout the array.

Most Josephson logic devices have to be reset after switching to $v=2\Delta/e$. This is necessitated by the hysteresis characteristic in the d.c. I-V curve of the Josephson tunnelling junction. Once the junction switches to the $v=2\Delta/e$ state, mere removal of the logic conditions causing the switching does not insure that the junction will revert to the superconducting state. Typically, the junction is reset by reducing the gate current supplied to the junction.

It is an object of the present invention to provide a Josephson logic array having reduced crosstalk.

It is an object of the present invention to provide a Josephson logic array in which transients due to the switching of any Josephson junction are substantially prevented from passing into the output paths of adjacent logic devices.

It is a further object of the present invention to provide a Josephson logic array in which the Josephson junctions are automatically reset without the need for externally controlled resetting.

SUMMARY OF THE INVENTION

In accordance with the present invention, the problem of crosstalk in a Josephson logic array is substantially reduced or eliminated and the junctions are self-reset, i.e., reset without the need for externally controlled resetting.

The invention comprises the inclusion of high and low impedance transmission line sections in the feeder line between adjacent junctions connected in series to the same feeder line. Specifically, a low impedance section is in the feeder line between adjacent junctions and each of the junctions is separated from the low impedance section by a high impedance section.

When the junction switches, current transients flow down the high impedance section toward the adjacent junction. However, the impedance mismatch at the high/low interface results in reflection of most of the current pulse. Consequently, the transient current reaching the adjacent junction is substantially reduced or eliminated. Additionally, as the reflections travel back to the switched junction they reduce the junction current sufficiently to reset the junction to the superconducting state.

BRIEF DESCRIPTION OF THE DRAWINGS

FIGS. 1A and 1B illustrate perspective and schematic views of a portion of a Josephson logic gate.

FIG. 2 is a schematic illustration of a portion of a Josephson logic array having three Josephson logic devices connected in series with the same feeder line.

FIG. 3 is a schematic illustration of a preferred embodiment of the present invention.

DETAILED DESCRIPTION OF THE PREFERRED EMBODIMENT

Referring to FIGS. 1A and 1B, there is shown a portion of a Josephson logic device. A perspective representation of the structure appears in FIG. 1A and a schematic of the same device appears in FIG. 1B. The junction 10 comprises overlapping portions of superconductors 12 and 14 and tunnelling oxide 16. Superconductors 12 and 14 also constitute the feeder line which carries the gate current from an external source to the junction 10. Superconductors 18, 20 and impedance 22 comprise an output path connected in parallel with junction 10.

The illustrated device lays on an electrical insulating layer 11 which in turn lays on a superconducting ground plane 13. Also, one or more superconducting control lines, such as line 15, overlays and is insulated from junction 10. The currents applied to the superconducting control lines represent the logic inputs to the device.

When the junction is in the superconducting state, the voltage across the junction is $v=0$ and the output current, $I_{out}$, is zero. When the right combination of logic inputs is applied to the control lines, the junction switches to the non-superconducting state and the voltage across the junction becomes $v=2\Delta/e$ (or less), where $2\Delta/e$ is the junction gap voltage. This causes an output current, $I_{out}=2\Delta/eZ$, to ultimately appear in the output path. If Z is matched to the characteristic impedance of the lines 18, 20, the output current will appear in the output path almost immediately.

The removal of the correct logic combination will not necessarily reset the junction to the $v=0$ state. Typically, the junction has to be reset by lowering the gate current $I_g$ to some minimum value, although techniques for self-resetting the junction have been known prior to the present invention.

Although the superconducting lines 12, 14, 18 and 20 present zero impedance to d.c. currents, they are, in combination with the ground plane and intermediate insulator, transmission lines having finite non-zero characteristic impedances. When multiple Josephson logic devices of the type illustrated in FIGS. 1A and 1B are connected in series in a Josephson logic array, the flow of transient currents via the transmission lines presents a problem of crosstalk.

The above problem can be appreciated by referring to FIG. 2 which is a schematic illustration of three Josephson logic devices. The junctions 30, 32 and 34 are connected in series in the same feeder path for the purpose of reducing the total current supply needed for the junctions. It is assumed a d.c. current $I_g$ is applied as indicated.

If the correct logic combination (not shown) exists to switch only junction 32 to the $v=2\Delta/e$ state, a current will appear in output path 38. That current may simply be used to designate a logic 1 output from the particular device or it may serve as a control line logic input to a subsequent Josephson device (not shown) in the same array.

Also, when junction 32 switches to the $v=2\Delta/e$ state, voltage transients $+\Delta/e$ and $-\Delta/e$ appear at points 42 and 44. Current pulse transients associated with the voltage transients travel via the transmission line paths toward the logic device comprising junction 30 and output path 36 and toward the logic device comprising junction 34 and output path 40. The output paths 36, 38 and 40 are terminated in suitable impedances, generally labelled Z in this figure. The transient currents not only travel through the feeder line, transmission lines and the unswitched junction, they also travel down the output path transmission lines. The transient current in the output path can be detected as a false logic 1 output or can falsely trigger a subsequent logic device. This problem is referred to as crosstalk.

A solution to the problem is illustrated in FIG. 3 wherein three Josephson logic devices are shown with their respective junctions 60, 62, 64 connected in series in the same feeder line. As in the other drawings, the ground plane, insulators and control lines are now not shown.

The feeder line which carries the gate current $I_g$ to the junctions consists of sections 66, 72, 78 and 84 having a low characteristic impedance, $Z_L$, and sections 68, 70, 74, 76, 80 and 82 having a high characteristic impedance, $Z_H$. This arrangement not only substantially reduces or prevents crosstalk, it also enables self-resetting of the junctions.

In FIG. 3, the junctions 60, 62 and 64 are each connected to an output circuit, where the circuit terminations are labelled Z, to be consistent with the terminology previously utilized for FIGS. 1A, 1B and 2.

If the junction 62 switches to the $v=2\Delta/e$ state, voltage transients of $+\Delta/e$ and $-\Delta/e$ appear on opposite sides of the junction. These transients create current pulses which travel down the transmission lines formed by the feeder line-insulator-ground plane. However, the current pulse transients are reflected at the high impedance-low impedance mismatch. The amount of reflection depends on the mismatch. Consequently, the transient currents travelling into the adjacent logic devices will be eliminated or substantially reduced by the configuration shown. Furthermore, the current pulses reflected at the impedance mismatch travel back to the switched junction and oppose the d.c. gate current thereby reducing the current through the junction to a low enough value to cause the junction to be reset.

The feeder line, as in the prior art, comprises superconducting materials overlaying and insulated from the ground planes. The difference is that different sections of the feeder line have high and low characteristic impedances, respectively. As an example, the ratio of $Z_H/Z_L$ may be 10, although this is by no means the only suitable ratio. The ratio $Z_H/Z_L$ is chosen to provide proper isolation between Josephson tunnelling devices and to obtain sufficient current reflection to cause resetting of the Josephson devices. In general, the larger the ratio $Z_H/Z_L$, the smaller the amount of energy which is leaked beyond the reflection point of the circuit, and the greater the ease of resetting the tunnel device. Consequently, it is advantageous from a circuit design basis to provide sufficiently high $Z_H/Z_L$ ratios to achieve these goals. The absolute values, as opposed to the relative values, of the impedances are not important to this invention and will be determined by other factors, such as desired device geometry and materials.

Several techniques for controlling the characteristic impedance of a transmission line of the type formed in a Josephson logic device are well known. Any technique which will provide the described impedance arrangement would be suitable. As examples, the characteristic impedance may be decreased by, increasing the width of the superconductor as indicated diagrammatically in FIG. 3, using a thinner insulator between the feeder line and the ground plane, using an insulator with an increased dielectric constant, or using an insulator with a smaller magnetic permeability.

The characteristic impedance can be increased by decreasing the width of the superconductor, using a thicker insulator between the feeder line and the ground plane, using an insulator with a decreased dielectric constant, or by using an insulator with a larger magnetic permeability.

Also, although it does not appear to be critical, it is preferable for the transmission lines formed by the superconductor in the output path to have a characteristic impedance intermediate to that of the high and low sections of the feeder line. This is also selected with respect to the desired $Z_L/Z_L$ ratio, considering the features of automatic resetting and isolation which have been discussed above.

What is claimed is:

1. A Josephson array comprising at least two Josephson junctions connected in series in a line adapted to carry current to said junctions, said junctions generating transients due to switching, said line including means disposed between said two junctions for substantially preventing said transients from passing between said two junctions.

2. A Josephson array as claimed in claim 1 wherein said last mentioned means is a characteristic impedance mismatch in said line.

3. A Josephson array as claimed in claim 1 wherein said means for reducing comprises first, second and third sections of said line having relatively high, low and high, respectively, characteristic impedances, said first section connected at one end to one of said junctions and at the other end to one end of said second section, the other end of said second section connected to one end of said third section, the other end of said third section connected to said other junction.

4. The array of claim 1, where said line is comprised of a superconductive material.

5. A Josephson array comprising a superconducting ground plane, an insulator layer overlaying said ground plane, a plurality of feeder line superconducting paths overlapping one another with tunnelling barriers therebetween forming a feeder line superconductor with a plurality of Josephson tunnelling junctions connected in series in said feeder line, output circuit paths connected in parallel with said junctions and comprising superconducting output lines, control lines adjacent to said junctions, said feeder line superconducting paths forming a transmission line with said ground plane and said insulating layer, said feeder line superconducting paths between any two of said series connected junctions comprising two characteristic impedance mismatches.

6. A Josephson array as claimed in claim 5 wherein said feeder line superconducting paths between any two of said series connected junctions consists of three sections formed in series between the said two junctions, the first and third sections, which contact said two junctions, respectively, have substantially equal characteristic impedances, and the second section, which joins said first and third sections, having a characteristic impedance substantially less than said equal characteristic impedances.

7. A Josephson array as claimed in claim 6 wherein the impedance mismatch between said first and second, and said second and third sections, is great enough to cause substantially all of a transient current caused by either junction switching to a finite voltage state to be reflected at the mismatch interfaces between said section and enable self-resetting of the switched junction.

8. A Josephson junction as claimed in claim 7 wherein said superconducting output lines form transmission lines with said ground plane and said insulator layer, said latter transmission lines having a characteristic impedance intermediate the characteristic impedances of said first and second sections.

9. A Josephson junction array comprising at least two Josephson junctions connected in series, said junctions generating transients due to switching, and means disposed between said two junctions for substantially preventing said transients from passing between said two junctions.

10. A Josephson junction array as claimed in claim 9 wherein said means for reducing cross-talk comprises means for causing reflection in the series connection of said two junctions of a transient signal which is caused when one of said junctions switches from a zero voltage state to a finite voltage state.

11. A Josephson junction circuit comprising at least a single Josephson junction adapted for switching from the zero voltage state to a finite voltage state, said switching producing at least a single current pulse transient, a current source, and means disposed in series with said junction and said source for containing said at least a single current pulse transient to the location of said single Josephson junction.

12. A Josephson junction circuit as claimed in claim 11 wherein said means for containing comprises means disposed in series with said junction for providing an impedance mismatch to said current pulse transient.

13. A Josephson junction circuit comprising a current source, at least a single latching Josephson junction adapted for switching from a zero voltage state to a finite voltage state connected to said source, and means disposed in series with said source and said junction for resetting said junction from the finite voltage state to the zero voltage state.

14. A Josephson junction circuit as claimed in claim 13 wherein said resetting means comprises an impedance mismatch disposed in series with said junction.

15. A Josephson junction circuit comprising at least a single latching Josephson junction having a finite voltage state and a zero voltage state, means for switching said junction electrically connected thereto for switching said junction from the zero voltage state to the finite voltage state, the switching of said junction generating a current pulse transient, and means electrically connected to said junction for reflecting at least a portion of said current pulse transient said at least a portion being of sufficient magnitude to reset said junction from the finite voltage state to the zero voltage state.

16. A Josephson junction circuit as claimed in claim 15 wherein said means for reflecting comprises an impedance mismatch in series with said junction.

17. A Josephson junction circuit as claimed in claim 15 wherein said means for reflecting comprises a transmission line in series with said junction, said transmission line formed by a superconductor material overlying an insulator which overlies a ground plane conductor, said transmission line having at least two portions which have, respectively, different characteristic impedances, said two portions being in contact to form an impedance mismatch at the point of said contact.

* * * * *

UNITED STATES PATENT AND TRADEMARK OFFICE
CERTIFICATE OF CORRECTION

PATENT NO. : 4,029,975
DATED : June 14, 1977
INVENTOR(S) : Hans H. ZAPPE

It is certified that error appears in the above-identified patent and that said Letters Patent are hereby corrected as shown below:

Column 4, line 61 - delete "$Z_L/Z_L$" insert -- $Z_H/Z_L$ --

Signed and Sealed this

Fourteenth Day of February 1978

[SEAL]

Attest:

RUTH C. MASON
*Attesting Officer*

LUTRELLE F. PARKER
*Acting Commissioner of Patents and Trademarks*